(12) United States Patent
Liu et al.

(10) Patent No.: US 7,566,656 B2
(45) Date of Patent: Jul. 28, 2009

(54) METHOD AND APPARATUS FOR PROVIDING VOID STRUCTURES

(75) Inventors: Huang Liu, Singapore (SG); Johnny Widodo, Singapore (SG); Wei Lu, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 28 days.

(21) Appl. No.: 11/615,004

(22) Filed: Dec. 22, 2006

(65) Prior Publication Data

US 2008/0153252 A1    Jun. 26, 2008

(51) Int. Cl.
*H01L 23/485* (2006.01)

(52) U.S. Cl. .................. 438/667; 438/739; 257/621; 257/E21.597; 257/E23.011; 257/E23.067

(58) Field of Classification Search .......... 438/667, 438/739; 257/E21.597, E23.011, E23.067, 257/621

See application file for complete search history.

(56) References Cited

U.S. PATENT DOCUMENTS

| 2002/0090794 A1 | 7/2002 | Chang et al. |
| 2003/0224591 A1 | 12/2003 | Latchford et al. |
| 2004/0089903 A1* | 5/2004 | Fischer et al. ............... 257/414 |
| 2005/0037604 A1* | 2/2005 | Babich et al. ............... 438/619 |
| 2006/0030128 A1* | 2/2006 | Bu et al. ..................... 438/462 |
| 2007/0178713 A1* | 8/2007 | Jeng ........................... 438/787 |
| 2008/0014731 A1* | 1/2008 | Yang .......................... 438/587 |
| 2008/0185722 A1* | 8/2008 | Liu ............................. 257/751 |

OTHER PUBLICATIONS

B. Lee, Electroless CoWP Boosts Copper Reliability, Device Performance, Semiconductor International, Jul. 2004.

* cited by examiner

*Primary Examiner*—George Fourson
(74) *Attorney, Agent, or Firm*—Horizon IP Pte Ltd

(57) ABSTRACT

The present invention relates to integrated circuits. In particular, but not exclusively, the invention relates to a method and apparatus for connecting elements of integrated circuits with interconnects having one or more voids formed between adjacent interconnects. Embodiments of the invention provide apparatus for connecting elements in an integrated circuit device, comprising: at least one interconnect comprising one or more sidewalls; an interconnect sidewall spacer element arranged to provide structural support to the interconnect and formed on at least one of the interconnect sidewalls; and at least one void adjacent said interconnect and extending from the sidewall spacer element.

31 Claims, 9 Drawing Sheets

METHOD AND APPARATUS FOR PROVIDING VOID STRUCTURES

FIELD OF THE INVENTION

The present invention relates to integrated circuits. In particular, but not exclusively, the invention relates to a method and apparatus for connecting elements of integrated circuits with interconnects having one or more voids formed between adjacent interconnects.

DESCRIPTION OF THE RELATED ART

Integrated circuits (ICs) comprising many tens of thousands of devices including field effect transistors (FETs) and other devices are a cornerstone of modern microelectronic systems. These integrated circuits have structural elements associated with them. As the packing density of the devices increases, the number and complexity of wiring structures forming interconnections between the various elements increases. Connections between the elements of the IC are known as interconnects and are typically arranged in laterally extensive sheets or layers, known as traces. Interconnects within a given trace are separated by an intralevel dielectric, whilst individual traces are separated by layers of an interlevel dielectric. Connections between traces may be made by forming transverse interconnects which are often referred to as 'vias'.

As the proximity of a given interconnect to other interconnects decreases, an RC time constant associated with signal propagation along that interconnect increases for a given interconnect material. The RC time constant may be reduced by reducing the electrical resistance of the interconnect and/or reducing the dielectric constant k associated with interlevel and/or intralevel dielectric materials.

Modern integrated circuits typically employ copper as the material of choice for forming interconnects in preference to aluminium since copper has a lower electrical resistance than aluminium. The lowest values of dielectric constant k are achieved by forming voids between interconnects. A void may comprise a region of vacuum, or a region containing gas such as air.

Voids may be formed by removal of a sacrificial material deposited during the course of forming interconnects. The sacrificial material may be removed by thermal decomposition. In this case, the sacrificial material may be exhausted from the structure through vent apertures or by diffusion through a porous layer.

Alternatively, sacrificial material may be removed by etching, for example using a gaseous or liquid etchant. U.S. Pat. No. 6,228,770 discloses removal of a sacrificial layer by forming an aperture in a layer overlying the sacrificial layer.

In structures having voids formed between interconnects, it is found that the structural integrity of the interconnect is compromised by the presence of the void. Furthermore, during the course of removal of the sacrificial layer to form the void, sidewalls of the interconnect exposed to etchant may suffer corrosion, delamination or other degradation.

SUMMARY OF THE INVENTION

It is an aim of the present invention to at least partly mitigate at least one of the above-mentioned problems.

It is a further aim of embodiments of the invention to provide an improved interconnect structure. Another aim of embodiments of the present invention is to provide a fabrication method for an improved interconnect structure.

It is an aim of embodiments of the present invention to provide voids proximate to interconnects so as to control an RC time constant associated with the interconnects. Preferably structural support should be provided to ensure structural integrity of the overall structures.

According to a first aspect of the present invention there is provided a method for forming a void in a structure comprising providing a structure on a substrate, wherein the structure includes an intermediate layer between upper and lower layers, wherein the intermediate layer can be etched selectively to the upper and lower layers; forming first and second trenches in the structure; forming a first conformal layer lining the trenches; forming a second conformal layer lining the trenches over the first conformal layer, the first and second conformal layers can be etched selectively to each other, and wherein at least portions of the first and second conformal layer lining a bottom of the first and second trenches are removed; filling the trenches with a fill material; and removing the first conformal layer and intermediate layer to form a void in the structure between trenches with the fill material, the void defined by the second conformal layer and upper and lower layers.

According to a second aspect of the invention there is provided a method for connecting elements in an integrated circuit device comprising the steps of: forming at least one interconnect sidewall spacer element at locations where at least one interconnect is to be formed; forming at least one interconnect comprising one or more sidewalls, each interconnect having an interconnect sidewall spacer element on at least one sidewall; each spacer element providing structural support for the interconnect; forming at least one void adjacent each interconnect, each void extending from a respective sidewall spacer element; and for each interconnect, providing structural support via a respective sidewall spacer element, wherein the step of forming the sidewall spacer element further comprises the step of forming the sidewall spacer element from a material that is resistant to etching by a sacrificial spacer etchant.

According to a third aspect of the present invention there is provided an interconnection comprising a substrate having an upper surface; a conductive interconnect disposed on the substrate surface, the interconnect having a top surface and first and second sidewalls; an air gap located adjacent to the first sidewall of the conductive interconnect, wherein a top of the air gap is below the top surface of the interconnect, the top of the air gap formed by a top layer, wherein the top layer comprises an opening in communication with the air gap; and a sidewall spacer disposed on the first sidewall of the conductive interconnect, separating the interconnect and the air gap.

In various aspects of the invention, forming the second conformal layer further comprises the steps of forming the second conformal layer from a material that is resistant to etching by a sacrificial spacer etchant. The etchant, in one embodiment, comprises a buffered hydrofluoric acid, a dilute hydrofluoric acid or a combination thereof. The invention also forms at least one aperture in the upper layer in the structure. The aperture, in one embodiment, is in juxtaposition with sides of the second conformal layer lining the trench. The aperture is formed by removing the first conformal layer lining the sidewalls of the trenches. An aperture can also be formed in the lower layer. In one embodiment, forming the aperture in the lower layer precedes forming a via hole through one or more layers below the lower layer.

In various aspects of the invention, at least a portion of the intermediate layer between upper and lower layer serves as a sacrificial material. At least a portion of the intermediate layer is removed. In some embodiments, the intermediate layer is partially removed to form support structures between the upper and lower layers.

In various aspects of the invention, the lower layer serves as a bottom of the trenches formed in the stack. The first conformal layer lining the sidewalls of the trenches serves as disposable sidewall spacer elements. The second conformal layer lining sidewalls of the trenches form sidewall spacer elements for interconnects.

Embodiments of the invention have a reduced RC time constant associated with interconnects of an integrated circuit. The reduction in RC time constant is provided at least in part by the lower dielectric constant of a void compared with the dielectric constants of conventional dielectric materials.

Embodiments of the invention provide apparatus for connecting elements in an integrated circuit device having increased structural stability. Increased structural stability is provided at least in part by the provision of sidewall spacer elements on sidewalls of interconnects comprising the apparatus.

Embodiments of the invention provide apparatus for connecting elements in an integrated circuit having reduced susceptibility to deterioration due to exposure of the apparatus to an etchant or other reactive agent. Reduced susceptibility to deterioration is provided at least in part by sidewall spacer elements on sidewalls of interconnects comprising the apparatus.

BRIEF DESCRIPTION OF THE DRAWINGS

Embodiments of the present invention will now be described hereinafter, by way of example only, with reference to the accompanying drawings, in which.

DETAILED DESCRIPTION OF THE INVENTION

The following embodiments are intended to illustrate the invention more fully without limiting their scope, since numerous modifications and variations will be apparent to those skilled in the art.

Hereinafter reference will be made to the term 'interconnect'. It will be understood that the term should be broadly construed to include not only connections between elements of an IC arranged in the form of one or more traces, but also any suitable structure in which one or more conductive lines between elements of a system on a substrate are provided.

FIGS. 1 to 8 illustrate structures formed during fabrication of an interconnect structure 200 (FIG. 8) in accordance with an embodiment of the present invention.

Figure 1:
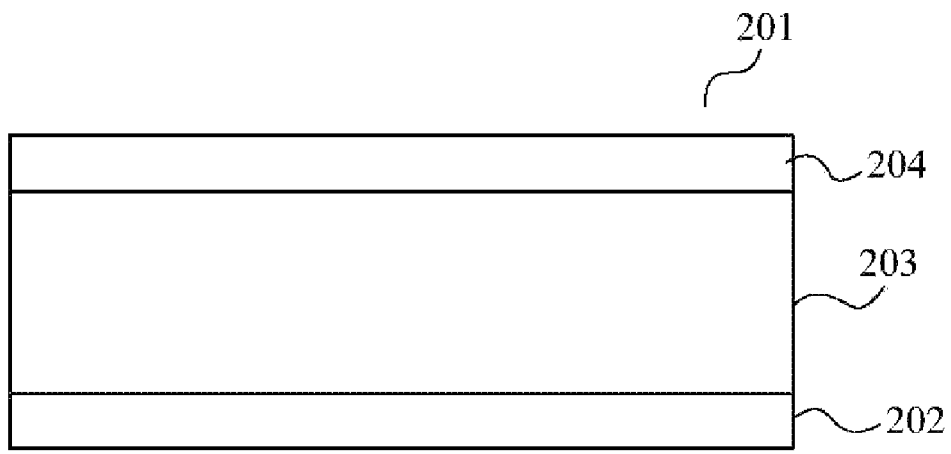
FIGS. 1 to 8 show structures formed during a process of fabricating an interconnect structure.

FIG. 1 shows a stack structure 201 formed over a semiconductor substrate. The stack structure 201 comprises a lower lateral layer 202, a sacrificial layer 203 above the lower lateral layer 202, and an upper lateral layer 204 above the sacrificial layer 203. The structure, for example can be an interconnect layer or metal layer of an IC. Typically, the interconnect layer is formed on a substrate comprising circuit components (e.g., transistors and capacitors). Forming the structure over other types of substrates is also useful.

In one embodiment, the lower lateral layer 202 is formed from silicon carbide. Other materials which can serve as an etch stop are also useful. Preferably, other dielectric materials which can serve as an etch stop are also useful. It will be appreciated that in accordance with other embodiments of the present invention the lower lateral layer 202 may alternatively be formed from silicon nitride, silicon carbon nitride or any other functionally equivalent material or combination thereof.

The sacrificial layer 203 is formed from a doped silicon oxide materials such as phosphosilicate glass (PSG), borophosphosilicate glass (BPSG), fluorine-doped silicate glass (FSG) and fluorinated silicate glass (FSG). It will be appreciated that in accordance with other embodiments of the present invention the sacrificial layer 203 may alternatively be formed from undoped silicon dioxide, oxymethylcyclotetrasiloxane (OMCTS), tetramethylcyclotetrasiloxane or any other functionally equivalent material or combination thereof. The sacrificial layer 203 is formed from a material that may be etched using an etchant that will not etch the lower lateral layer 202 or the upper lateral layer 204.

Upper lateral layer 204 is formed from silicon carbide. It will be appreciated that in accordance with other embodiments of the present invention the upper lateral layer 204 may alternatively be formed from silicon carbon nitride or any other functionally equivalent material or combination thereof.

Figure 2:
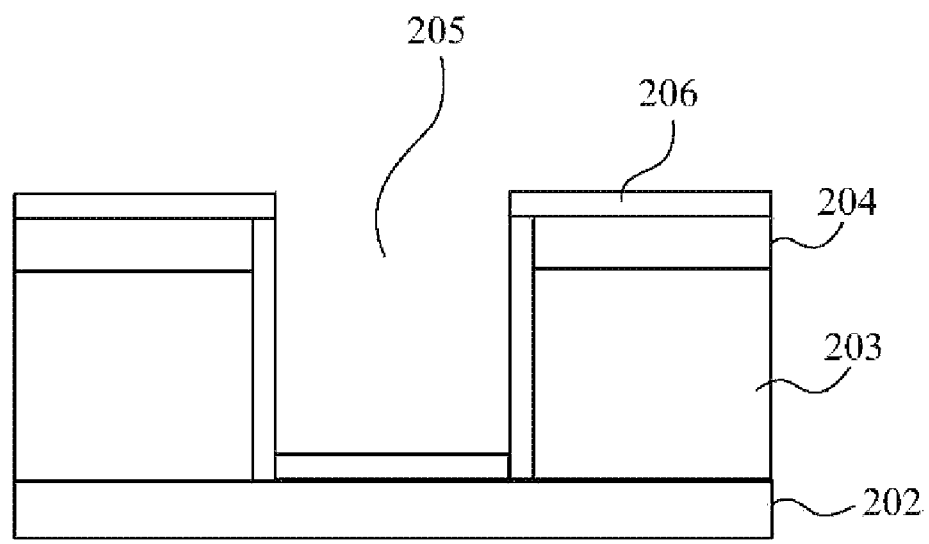

FIG. 2 shows the structure of FIG. 1 following formation of a trench 205 in the stack 201, followed by formation of a first conformal layer 206 over the resulting structure.

The trench 205 may be formed by conventional patterning followed by an etching process. The etching process is an anisotropic etching process such as a reactive ion etching process. Following etching of the trench, a lower boundary of the trench 205 is defined by lower lateral layer 202.

In one embodiment, interconnects are formed in the trench. Contacts can be provided below the structure to couple the interconnect with devices on the substrate. The contacts and interconnects can be formed by damascene or dual damascene techniques.

Figure 3:
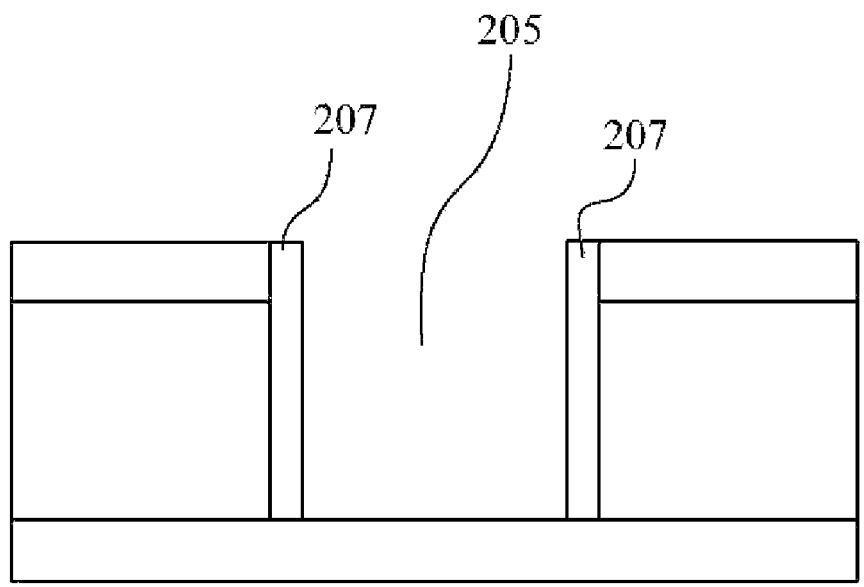

FIG. 3 shows the structure of FIG. 2 following the steps of reactive ion etching of the structure to remove portions of first conformal layer 206 formed on lateral surfaces of the structure. Following the reactive ion etching process, disposable sidewall spacer elements 207 are formed on sidewalls of the trench 205.

Figure 4:
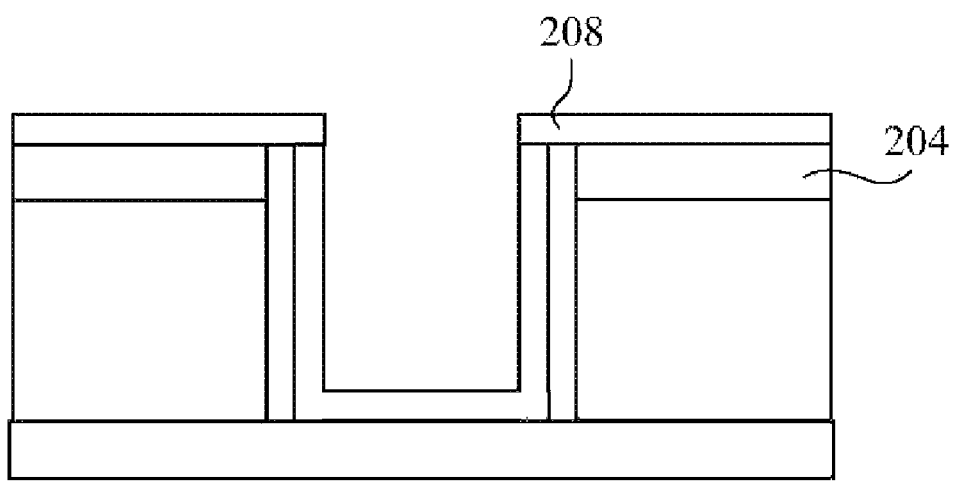

FIG. 4 shows the structure of FIG. 3 following formation of a second conformal layer 208 over the structure of FIG. 3. The second conformal layer 208, in one embodiment, is formed from silicon carbide. It will be appreciated that in accordance with other embodiments of the present invention the second conformal layer 208 may be formed from silicon nitride, silicon carbon nitride, or any other functionally equivalent material. For example, materials which the first conformal layer can be etched selectively thereto are also useful.

Figure 5:
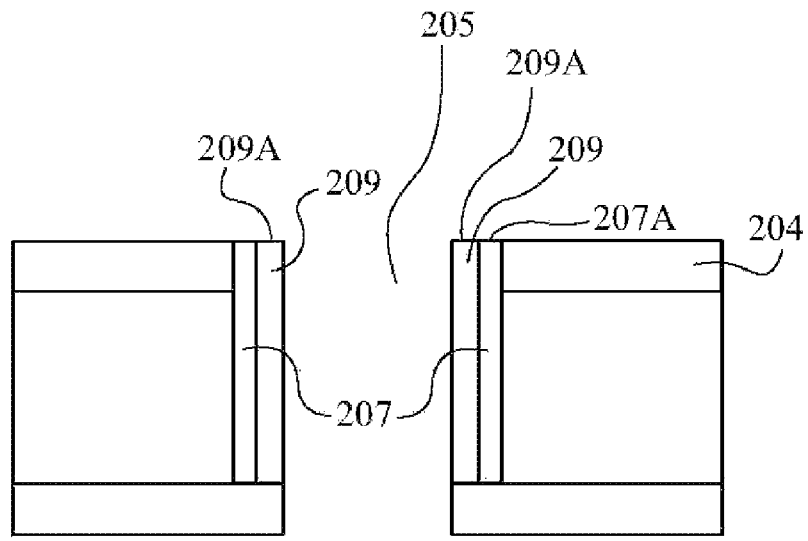

FIG. 5 shows the structure of FIG. 4 following reactive ion etching of the second conformal layer 208 to remove portions of second conformal layer 208 formed over lateral surfaces of the structure. Following reactive ion etching of second conformal layer 208, portions of second conformal layer 208 formed over disposable sidewall elements 207 remain, thereby forming interconnect sidewall spacer elements 209.

Figure 6:
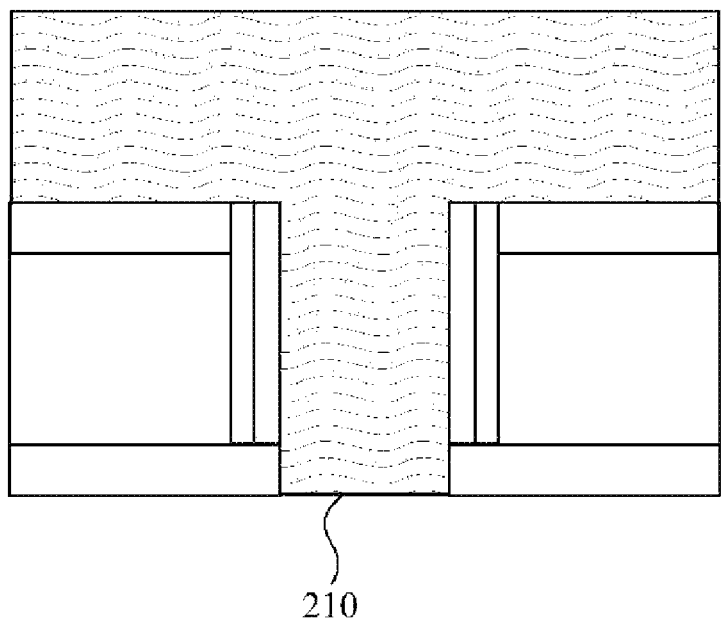

FIG. 6 shows the structure of FIG. 5 following formation of a barrier layer and a seed layer, and subsequent filling of trench 205 with interconnect material. In one embodiment, the interconnect material is copper. It will be appreciated that in accordance with other embodiments of the present invention other interconnect materials may be used, for example aluminium or any other functionally equivalent material.

The barrier layer is formed from tantalum nitride. It will be appreciated that in accordance with other embodiments of the present invention a Ta layer may be used instead of or in combination with TaN. The seed layer is formed from copper.

The interconnect material is deposited by electrochemical plating (ECP). It will be appreciated that in accordance with other embodiments of the present invention other deposition processes may be used.

Figure 7:
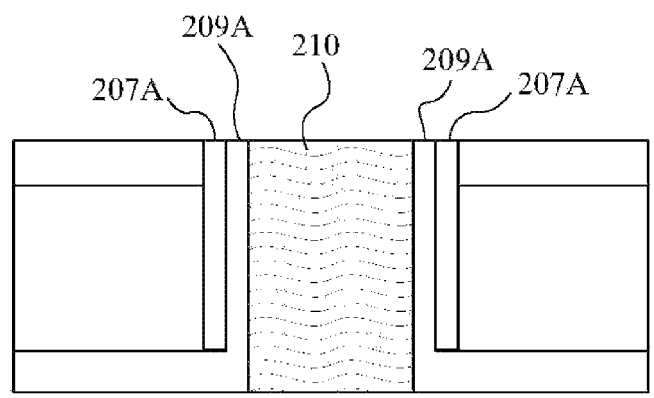

FIG. 7 shows the structure of FIG. 6 following chemical mechanical polishing (CMP) processing of the upper surface of the structure to remove interconnect material overlying lateral portions of the upper lateral layer 204. Interconnect 210 remains following CMP processing.

In one embodiment, after CMP of the structure, a self aligned cap layer can be formed over the interconnect. The cap layer serves to protect interconnect from chemical attack during subsequent wet etching. For example, the cap layer protects the interconnect from subsequent wet etching of the disposable sidewall spacer elements 207 and disposable layer 203. In one embodiment, the cap layer comprises a self aligned cobalt tungsten phosphide (CoWP) layer is formed on the surface of the copper interconnect. Formation of self aligned CoWP cap layer is described in, for example, Lee, "Electroless CoWP Boosts Copper Reliability, Device Performance, Semiconductor International, Jul. 1, 2004, which is herein incorporated by reference for all purposes. In alternative embodiments, a tungsten layer or copper silicon nitride layer may be formed instead of a CoWP layer.

CMP processing also results in exposure of end portions 207A, 209A of the disposable sidewall spacer elements 207 and interconnect sidewall spacer elements 209, respectively.

Figure 8:
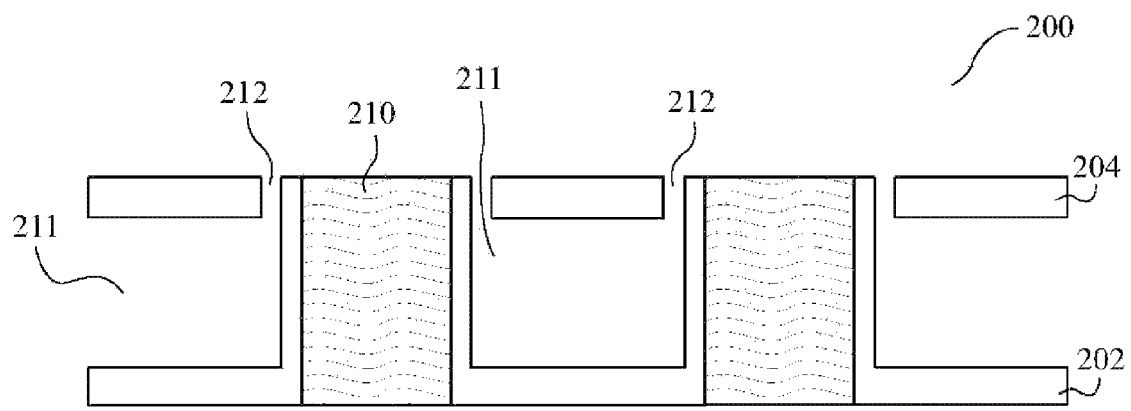

FIG. 8 shows the structure of FIG. 7 following etching of disposable sidewall spacer elements 207 and remaining portions of disposable layer 203 to form voids 211. From FIG. 8 it may be seen that gaps 212 are thereby formed between interconnect sidewall spacer elements 209 and remaining portions of upper lateral layer 204. Gaps 212 permit disposable sidewall spacer elements 207 and subsequently sacrificial layer 203 to be exposed to etchant. Gaps 212 also permit etched material to be exhausted from the void region following exposure to etchant. Gaps 212 may also be referred to as apertures 212.

The upper lateral layer can be supported by, for example, dielectric material (not shown) in other portions of the device. The dielectric material would be shown at other cross-sectional views.

Etching of disposable sidewall spacer elements 207 and remaining portions of disposable layer 203 removes substantially all material between adjacent sidewall spacers of adjacent interconnects. Remaining portions of upper lateral layer 204 and lower lateral layer 202 form an upper lateral wall element and lower lateral wall element, respectively.

The etchant is a wet etchant, more particularly the etchant is a buffered hydrofluoric acid (BHF) solution. It will be appreciated that in accordance with other embodiments of the present invention the etchant may be a dilute hydrofluoric acid solution (DHF), or any other suitable etchant that will not attack upper lateral layer 204, lower lateral layer 202, or interconnect sidewall spacer elements 209.

Figure 9:
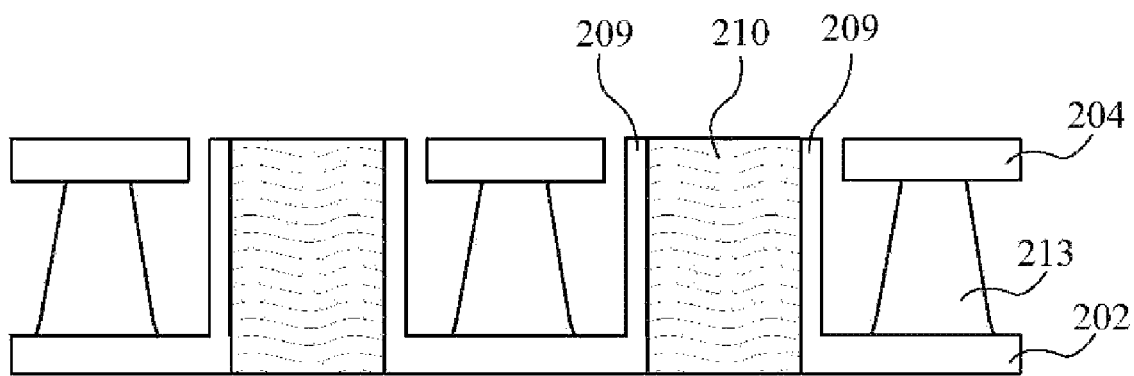
FIG. 9 shows a structure formed during a process of fabricating an interconnect structure.

FIG. 9 shows an alternative embodiment of the present invention in which structures are formed as per the steps described hereinabove but in which the structure of FIG. 7 is exposed to etchant such that incomplete removal of sacrificial layer 203 occurs. Portions of the sacrificial layer 203 that remain form support posts 213 extending between and in contact with lower lateral layer 202 and upper lateral layer 204. Support posts 213 provide mechanical support to upper lateral layer 204, enhancing the mechanical stability and integrity of the structure.

Interconnect sidewall spacer elements 209 provide structural support to interconnect 210. This enhances the structural integrity of interconnect 210. Furthermore, interconnect sidewall spacer elements 209 protect sidewalls of interconnect 210 from damage due to exposure of the apparatus to etchant and other corrosive agents, either during the process of forming voids or subsequently.

FIGS. 10 to 14 illustrate structures formed during fabrication of an interconnect structure 400 (FIG. 14) in accordance with a further embodiment of the present invention associated with a trench first dual damascene integration scheme. The scheme may be used to provide a transverse interconnect (via) between traces of an integrated circuit device, or between a trace and other structural elements of the integrated circuit. By reference to other structural elements is included structural elements of a field effect transistor such as a source electrode, a drain electrode, a gate electrode, or any other suitable structural element.

Figure 10:
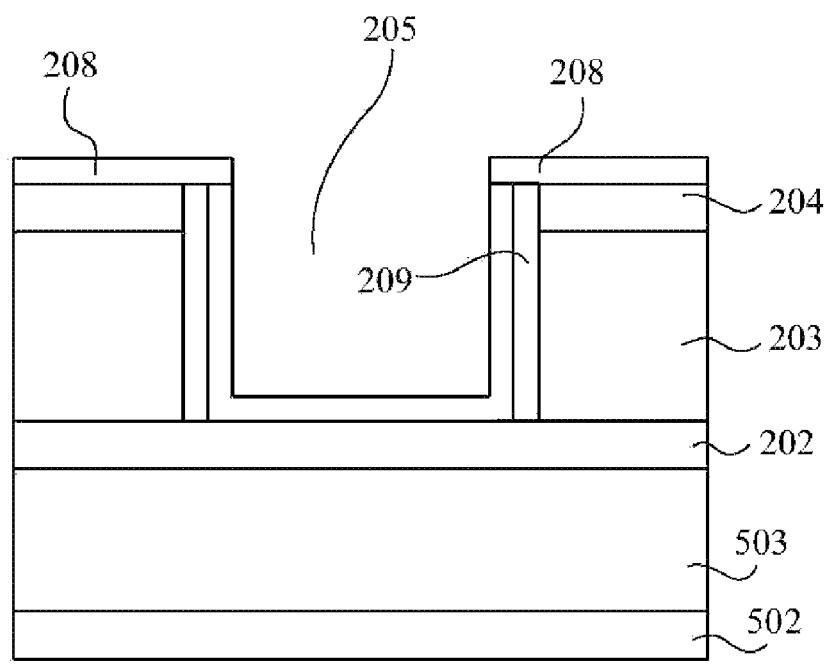
FIGS. 10 to 14 show structures formed during a process of fabricating an interconnect structure.

FIG. 10 shows the structure of FIG. 4 formed over a dielectric layer 503 formed over a layer 502. Dielectric layer 503 may be formed to separate interconnects in a first trace from interconnects in a second trace above the first trace, or interconnects in one trace from other structural elements below the trace.

Figure 11:
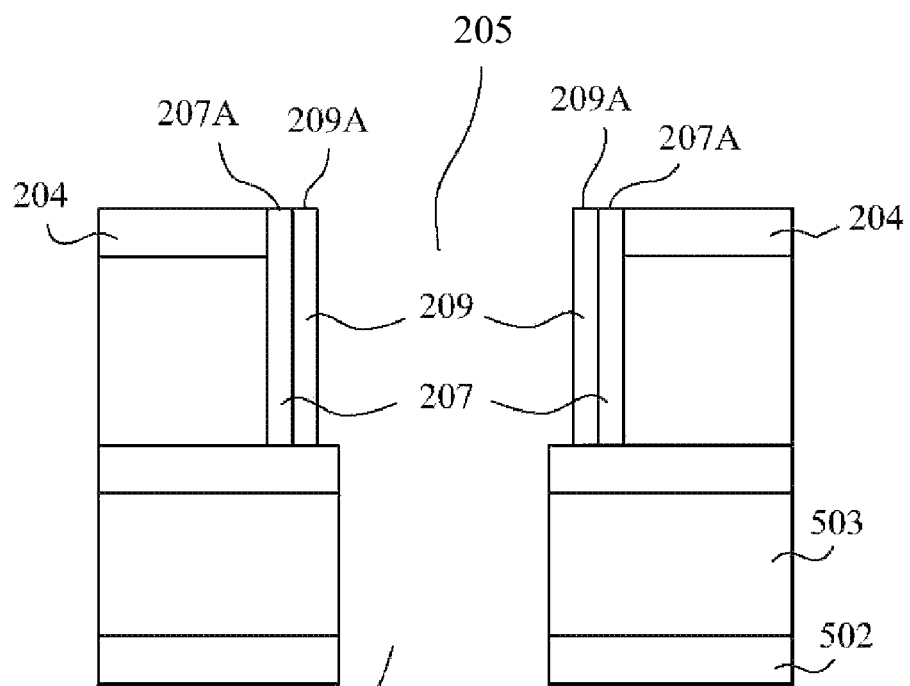

FIG. 11 shows the structure of FIG. 10 following formation of a via cavity 405 between trench 205 and a structure underlying layer 502. The via cavity 405 is formed by a process of patterning and etching. Lateral portions of second conformal layer 208 overlying an upper surface of the structure are also removed by an etching process.

The etching process is an anisotropic etching process, more particularly a reactive ion etching process.

Interconnect sidewall spacer elements 209 remains following removal of lateral portions of second conformal layer 208 overlying the upper surface of the structure.

End portions 207A, 209A of the disposable sidewall spacer elements 207 and interconnect sidewall spacer elements 209 are exposed following removal of lateral portions of second conformal layer 208 overlying the upper surface of the structure.

Figure 12:
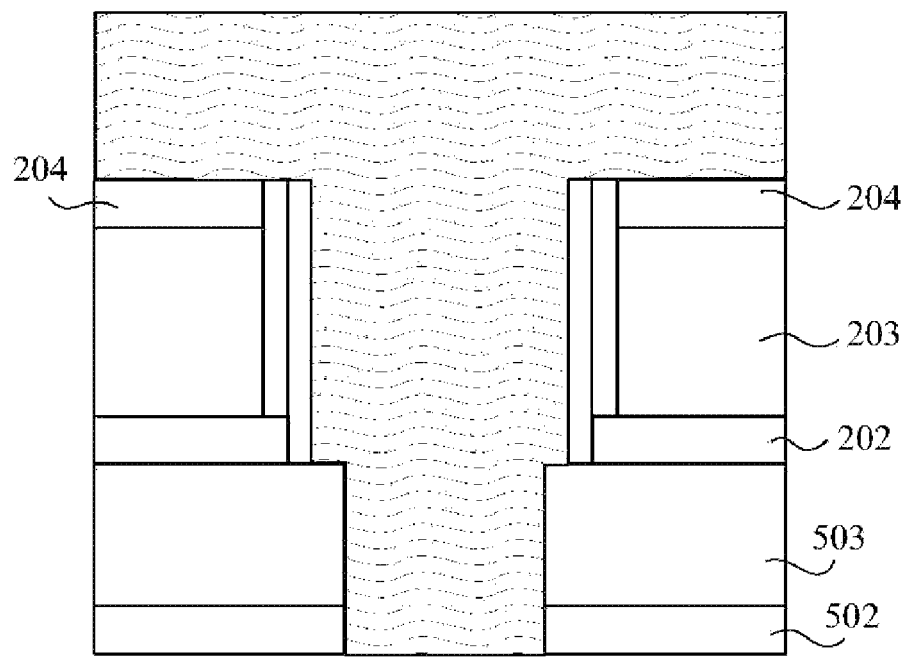

FIG. 12 shows the structure of FIG. 11 following formation of a barrier layer and a seed layer, and filling of the via cavity 405 and trench 205 with interconnect material. The barrier layer is formed from tantalum nitride. It will be appreciated that in accordance with other embodiments of the present invention a Ta layer may be used instead of or in combination with TaN. The seed layer is formed from copper. The interconnect material is deposited by electrochemical plating (ECP).

Figure 13:
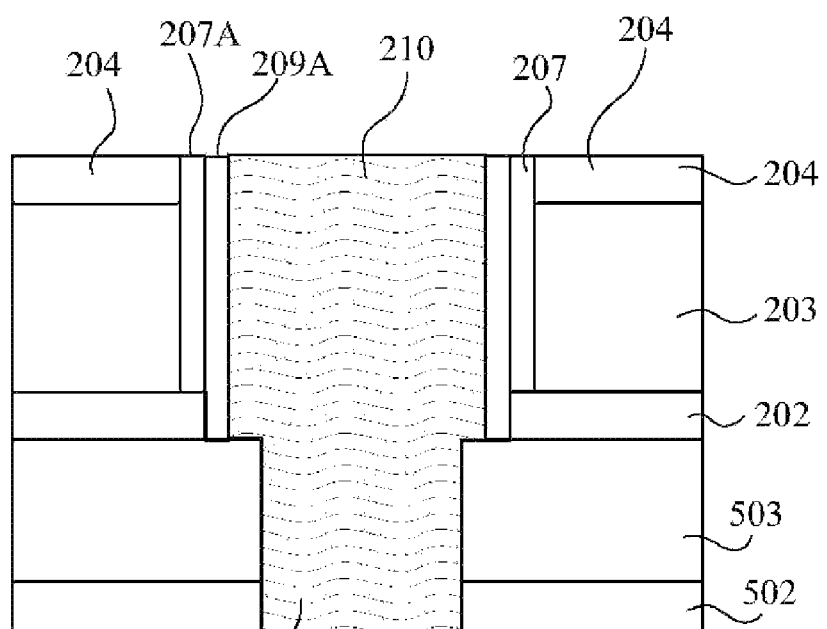

FIG. 13 shows the structure of FIG. 12 following CMP processing to remove material overlying lateral portions of the upper lateral layer 204. Interconnect 210 and via 510 remain following CMP processing.

CMP processing results in exposure of end portions 207A, 209A of the disposable sidewall spacer elements 207 and interconnect sidewall spacer elements 209.

Figure 14:
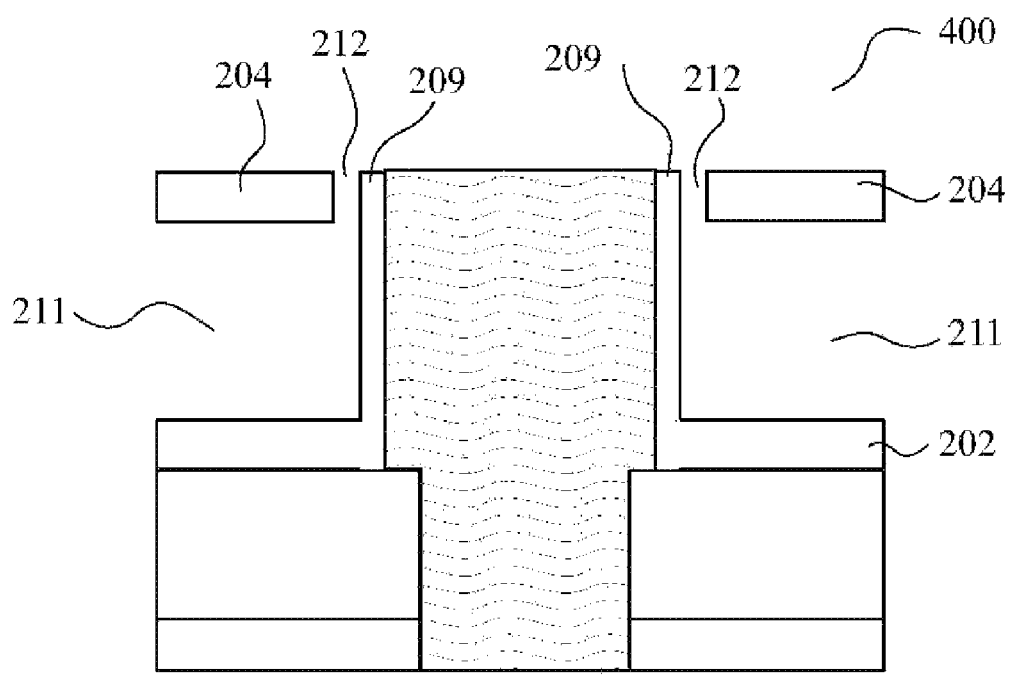

FIG. 14 shows the structure of FIG. 13 following etching of disposable sidewall spacer elements 207 and remaining portions of disposable layer 203 to form voids 211. From FIG. 14 it may be seen that removal of disposable sidewall spacer elements 207 results in the formation of gaps 212 between interconnect sidewall spacer elements 209 and remaining portions of upper lateral layer 204. Gaps 212 permit remaining portions of sacrificial layer 203 to be exposed to etchant.

The etchant is a wet etchant, more particularly the etchant is a buffered hydrofluoric acid (BHF) solution. In alternative embodiments of the invention the etchant is a dilute hydrofluoric acid solution (DHF), or any other suitable etchant that will not etch significantly upper lateral layer 204, lower lateral layer 202, or interconnect sidewall spacer elements 209.

Figure 15:
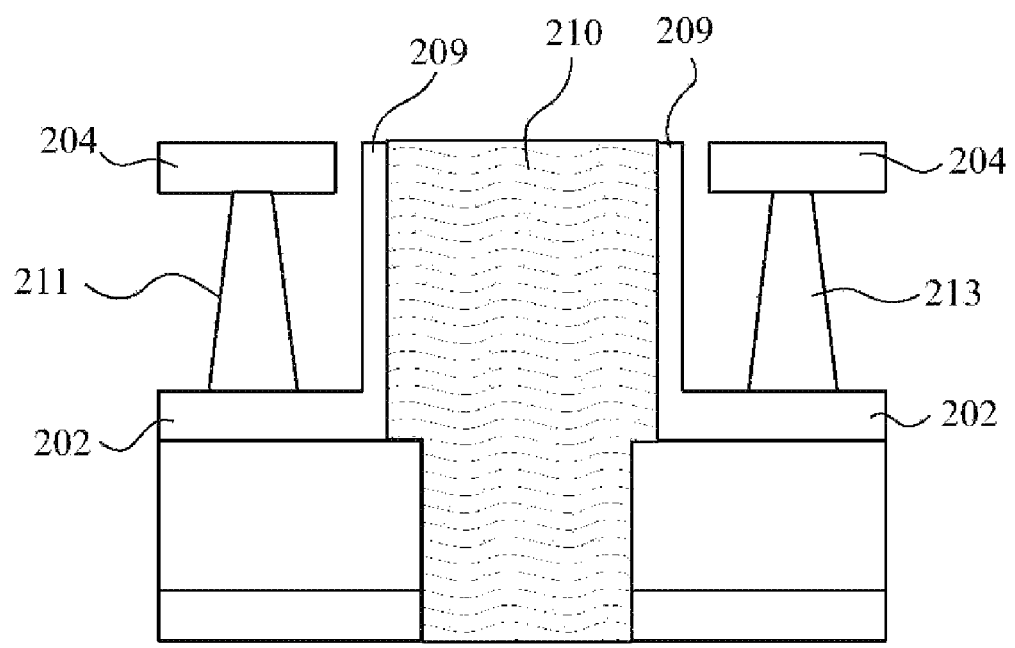
FIG. 15 shows a structure formed during a process of fabricating an interconnect structure.

FIG. 15 shows the structure of FIG. 13 following incomplete removal of sacrificial layer 203. Portions of sacrificial layer 203 that remain form support posts 213 extending between lower lateral layer 202 and upper lateral layer 204. Support posts 213 provide mechanical support to upper lateral layer 204, enhancing the mechanical stability and integrity of the structure.

The presence of interconnect sidewall spacer elements 209 provide structural support to interconnect 210. This enhances the structural integrity of interconnect 210. Furthermore, interconnect sidewall spacer elements 209 protect sidewalls of interconnect 210 from damage due to exposure to etchant and other corrosive agents, either during the process of forming voids or subsequently.

Figure 16:
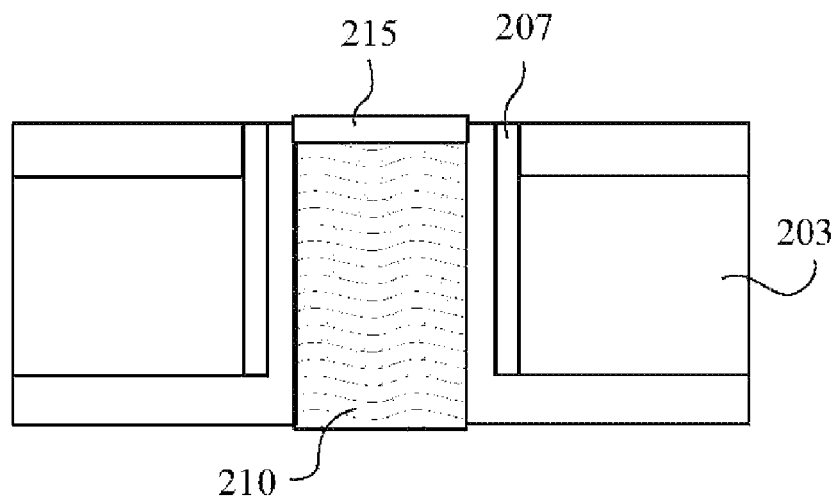
FIGS. 16 and 17 show structures formed during a process of fabricating an interconnect structure.
Figure 17:
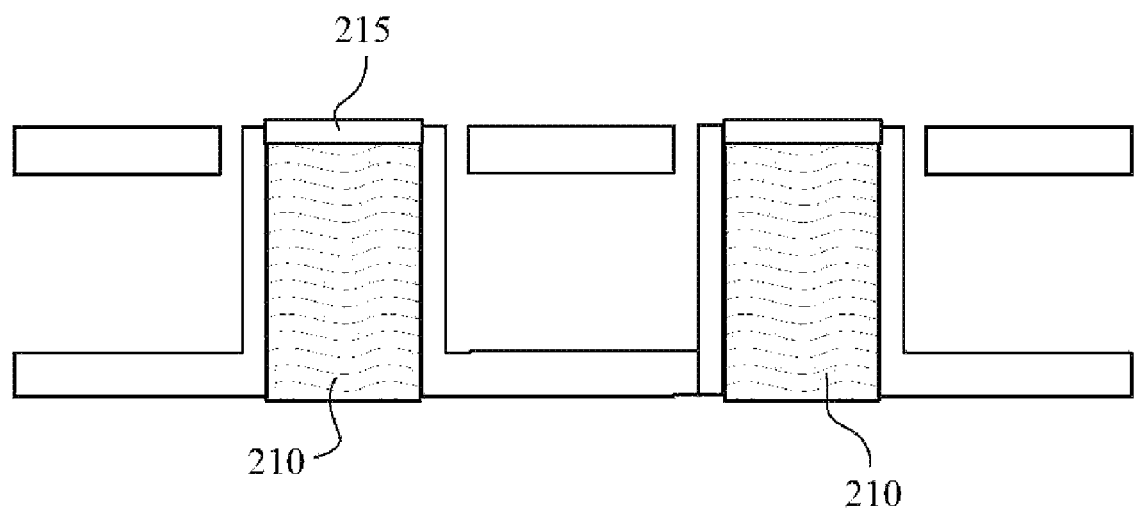

In some embodiments of the invention, a capping layer 215 (FIGS. 16, 17) is formed over the copper interconnect 210 before etching disposable spacer 207 and remaining portions of sacrificial layer 203. The capping layer 215 is formed in order to protect the interconnect from chemical attack by BHF or DHF etchant.

Capping layer 215 is formed from cobalt tungsten phosphide (CoWP). It will be appreciated that in accordance with other embodiments of the present invention the capping layer 215 may be formed from tungsten, copper silicon nitride, or any other functionally equivalent material.

It will be appreciated that some embodiments of the present invention will not include a capping layer 215 over the interconnect. Also, in some embodiments, the upper lateral layer can be removed after formation of the void. In yet other embodiments, the void can be formed by providing an opening in the upper layer which enables access to the underlying material to be removed.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. A method for forming a void in a structure comprising:
providing a structure on a substrate, wherein the structure includes an intermediate layer between upper and lower layers, wherein the intermediate layer can be etched selectively to the upper and lower layers;
forming a trench in the structure;
depositing a device layer over the substrate on the upper layer and lining the trench and forming first sidewall spacers lining sidewalls of the trench from the device layer;
forming second sidewall spacers in the trench on the first sidewall spacers, the first and second sidewall spacers can be etched selectively to each other;
forming a barrier layer to line the second sidewall spacers in the trench;
filling the trench with a fill material; and
removing the first sidewall spacers and at least a portion of the intermediate layer selective to the second sidewall spacers and upper and lower layers to form voids in the structure between the upper and lower layers adjacent to the trench with the fill material, wherein the upper layer over the voids is present prior to and during the removing of the first sidewall spacers and at least a portion of the intermediate layer.

2. The method of claim 1 wherein the structure comprises an interconnect layer of an integrated circuit.

3. The method of claim 2 wherein the fill material comprises copper.

4. The method of claim 3 farther comprises forming a cap layer over the fill material in the trench.

5. The method of claim 2 wherein the fill material comprises a conductive material.

6. The method of claim 5 further comprises forming a cap layer over the fill material in the trench.

7. The method of claim 1 wherein the fill material comprises copper.

8. The method of claim 1 wherein the fill material comprises a conductive material.

9. The method of claim 8 wherein the upper and lower layers and second sidewall spacers comprise a material selected from silicon carbide, silicon nitride, silicon carbon nitride or a combination thereof.

10. The method of claim 9 wherein the intermediate layer and first sidewall spacers comprise a material selected from silicon oxide, doped silicate glass or a combination thereof.

11. The method of claim 1 wherein the first sidewall spacers and intermediate layer can be removed selectively to the upper, lower and second sidewall spacers with a wet etchant.

12. The method of claim 11 wherein the upper and lower layers and second sidewall spacers comprise a material selected from silicon carbide, silicon nitride, silicon carbon nitride or a combination thereof.

13. The method of claim 12 wherein the intermediate layer and first sidewall spacers comprise a material selected from silicon oxide, doped silicate glass or a combination thereof.

14. A method for forming an interconnect in an integrated circuit device comprising:
providing a substrate prepared with a structure having a dielectric layer between lower and upper layers;
forming a trench in the structure;
depositing a device layer over the upper layer and lining the trench and removing the horizontal portions of the device layer to form first sidewall spacers lining sidewalls of the trench;
forming second sidewall spacers in the trench on the first sidewall spacers;
forming a barrier layer to line the second sidewall spacers;
filling the trench with conductive material, wherein a top surface of the conductive material is coplanar with a top surface of the upper layer, the conductive material in the trench forms the interconnect; and
selectively removing the first sidewall spacers and at least a portion of the dielectric layer to form voids adjacent to the trench between upper and lower layers, wherein the upper layer over the voids is present prior to and during selective removal.

15. A structure comprising:
a substrate on which the structure is disposed;
an upper layer having a top surface defining a top surface of the structure;
a lower layer having a bottom surface defining a bottom surface of the structure;
a feature disposed in the structure;
a barrier layer lining sidewalls of the feature;
sidewall spacers on the barrier layer which lines the sidewalls of the feature; and
a void in the structure adjacent to the spacers, wherein the void is defined by a bottom surface of the upper layer, a top surface of the lower layer and one of the sidewall spacers.

16. The method of claim 14 wherein:
forming a trench includes forming first and second trenches with first and second sidewall spacers on sidewalls of the trenches and first and second interconnects; and
selectively removing the first sidewall spacers and at least a portion of the dielectric layer forms at least one void between the interconnects.

17. The method of claim 16 wherein removing the at least a portion of the dielectric layer forms at least one void, with remaining portions of the dielectric layer serving as a support between the upper and lower layers.

18. The method of claim 14 wherein removing the at least a portion of the dielectric layer forms the void, with remaining portions of the dielectric layer serving as a support between the upper and lower layers.

19. The method of claim 14 wherein the conductive material comprises copper.

20. The method of claim 19 further comprises forming a cap layer on the substrate over the conductive material in the trench.

21. The method of claim 19 wherein:
the upper and lower layers and second sidewall spacers comprise a material selected from silicon carbide, silicon nitride, silicon carbon nitride or a combination thereof; and
the dielectric layer and first sidewall spacers comprise a material selected from silicon oxide, doped silicate glass or a combination thereof.

22. The method of claim 19 wherein the first sidewall spacers and dielectric layer can be removed selectively to the upper and lower layers and the second sidewall spacers with a wet etchant.

23. The method of claim 14 wherein the first sidewall spacers and dielectric layer can be removed selectively to the upper and lower layers and the second sidewall spacers with a wet etchant.

24. The method of claim 23 wherein:
the upper and lower layers and second sidewall spacers comprise a material selected from silicon carbide, silicon nitride, silicon carbon nitride or a combination thereof; and
the dielectric layer and first sidewall spacers comprise a material selected from silicon oxide, doped silicate glass or a combination thereof.

25. The structure of claim 15 wherein the void comprises a support between the upper and lower layers.

26. The structure of claim 25 wherein the support between the upper and lower layers comprises a material selected from silicon oxide, doped silicate glass or a combination thereof.

27. The structure of claim 15 wherein the feature comprises a conductive interconnect feature.

28. The structure of claim 27 wherein the void comprises a support between the upper and lower layers.

29. The structure of claim 15 comprises:
a gap between the upper and lower layers; and
a cap layer over the top of the feature.

30. The structure of claim 29 wherein the upper and lower layers and the spacers comprise a material selected from silicon carbide, silicon nitride, silicon carbon nitride or a combination thereof.

31. The structure of claim 15 wherein the upper and lower layers and the spacers comprise a material selected from silicon carbide, silicon nitride, silicon carbon nitride or a combination thereof.

* * * * *